(12) United States Patent
Hamby et al.

(10) Patent No.: US 9,000,453 B2
(45) Date of Patent: Apr. 7, 2015

(54) ELECTROSTATIC DISCHARGE PROTECTION FOR ELECTRICAL COMPONENTS, DEVICES INCLUDING SUCH PROTECTION AND METHODS FOR MAKING THE SAME

(71) Applicants: David Hamby, Andover, MA (US); Adam Scotch, Amesbury, MA (US)

(72) Inventors: David Hamby, Andover, MA (US); Adam Scotch, Amesbury, MA (US)

(73) Assignee: Osram Sylvania Inc., Danvers, MA (US)

( * ) Notice: Subject to any disclaimer, the term of this patent is extended or adjusted under 35 U.S.C. 154(b) by 249 days.

(21) Appl. No.: 13/724,713

(22) Filed: Dec. 21, 2012

(65) Prior Publication Data

US 2013/0114174 A1    May 9, 2013

Related U.S. Application Data

(63) Continuation-in-part of application No. 13/170,276, filed on Jun. 28, 2011.

(51) Int. Cl.
| | | |
|---|---|---|
| *H01L 21/00* | (2006.01) | |
| *H02H 3/20* | (2006.01) | |
| *H05K 1/02* | (2006.01) | |
| *H05K 1/18* | (2006.01) | |
| *H02H 7/20* | (2006.01) | |

(Continued)

(52) U.S. Cl.
CPC ............ *H02H 3/20* (2013.01); *H05K 1/0259* (2013.01); *H05K 1/189* (2013.01); *H05K 2201/0329* (2013.01); *H05K 2201/10106* (2013.01); *H05K 1/16* (2013.01); *H05K 2201/0738* (2013.01); *H05K 2201/10174* (2013.01); *H02H 7/20* (2013.01); *H02H 9/046* (2013.01)

(58) Field of Classification Search
None
See application file for complete search history.

(56) References Cited

U.S. PATENT DOCUMENTS

| | | | |
|---|---|---|---|
| 7,695,644 | B2 | 4/2010 | Kosowsky et al. |
| 7,825,491 | B2 | 11/2010 | Kosowsky |
| 2002/0024791 | A1 | 2/2002 | Whitney et al. |

(Continued)

FOREIGN PATENT DOCUMENTS

| | | |
|---|---|---|
| DE | 102007061479 | 6/2009 |
| EP | 1601019 | 11/2005 |

(Continued)

OTHER PUBLICATIONS

K. Allen, How ESD damage affects OEMs and what they can do to mitigate the damage, reprinted from PC/104 Embedded Solutions / Winter 2002.

(Continued)

*Primary Examiner* — Charles Garber
*Assistant Examiner* — Evren Seven
(74) *Attorney, Agent, or Firm* — Robert F. Clark

(57) ABSTRACT

Systems and methods for protecting electrical components such as light emitting diodes are described. In some embodiments, electrical components are protected from high level electrostatic discharge ("ESD") events by a circuit board that provides an intrinsic level of ESD protection. At the same time, such electrical components are protected against low level ESD events by one or more diodes that are electrically coupled thereto. The one or more diodes may be thin film diodes comprising at least one layer of p-type semiconductive material and at least one layer of n-type semiconductive material. Devices including ESD protection and methods for manufacturing such devices are also described.

5 Claims, 9 Drawing Sheets

(51) Int. Cl.
*H05K 1/16* (2006.01)
*H02H 9/04* (2006.01)

(56) References Cited

U.S. PATENT DOCUMENTS

| | | | |
|---|---|---|---|
| 2006/0060880 A1* | 3/2006 | Lee et al. | 257/99 |
| 2007/0236443 A1* | 10/2007 | Lee | 345/102 |
| 2007/0238311 A1 | 10/2007 | Levy | |
| 2008/0265272 A1* | 10/2008 | Oh et al. | 257/99 |
| 2008/0290353 A1 | 11/2008 | Medendorp, Jr. et al. | |
| 2009/0278139 A1* | 11/2009 | Fjelstad | 257/88 |
| 2010/0090176 A1 | 4/2010 | Kosowsky et al. | |
| 2010/0270578 A1 | 10/2010 | Sorg et al. | |
| 2011/0211289 A1* | 9/2011 | Kosowsky et al. | 361/91.1 |
| 2012/0104450 A1* | 5/2012 | Chen et al. | 257/99 |
| 2012/0200963 A1* | 8/2012 | Vasquez et al. | 361/56 |
| 2013/0001596 A1* | 1/2013 | Scotch et al. | 257/88 |
| 2013/0114174 A1 | 5/2013 | Hamby et al. | |
| 2013/0194708 A1* | 8/2013 | Lovskog et al. | 361/56 |

FOREIGN PATENT DOCUMENTS

| | | |
|---|---|---|
| WO | WO 01/17320 | 3/2001 |
| WO | WO 2006/074462 | 7/2006 |
| WO | WO 2007/062171 | 5/2007 |
| WO | WO 2008/143526 | 11/2008 |

OTHER PUBLICATIONS

Liu et al., Polymer-Based Rectifying Diodes on a Glass Substrate Fabricated by Ink-Jet Printing, Macromol. Rapid Commun., 26 (2005) 289-292.

* cited by examiner

ELECTROSTATIC DISCHARGE PROTECTION FOR ELECTRICAL COMPONENTS, DEVICES INCLUDING SUCH PROTECTION AND METHODS FOR MAKING THE SAME

TECHNICAL FIELD

This application generally relates to providing electrostatic discharge (ESD) protection on printed circuit boards, and, more particularly, to providing such protection in light emitting diode (LED) systems.

BACKGROUND

Damage to electronic components from electrostatic discharge is a well-documented problem. The financial cost of such damage can by some estimates exceed ten percent of the annual gross sales of an electronic product. It may also affect productivity and product reliability across a broad spectrum of the electronics industry.

Light emitting diodes (LEDs) are one type of electronic component subject to damage by ESD. ESD damage can occur during manufacturing, handling, packaging or installation of LEDs. Large numbers of LEDs are often aggregated onto modules to create lighting systems which require ESD protection. Surface mount and chip-on-board technologies have been developed to provide ESD protection for LEDs and other electronic circuits, but suffer from one or more drawbacks. For example, such technologies may require pick and placement of large numbers of surface mount diodes, and/or complex manufacturing techniques. Circuit boards including integral (e.g., embedded) ESD protection have also been developed to address these issues, but may not provide adequate protection for components such as LEDs. In particular, a circuit board with integral ESD protection may not protect such components against ESD events that produce relatively small voltage and associated current in reverse bias.

BRIEF DESCRIPTION OF THE DRAWINGS

Reference is now made to the following detailed description, which should be read in conjunction with the following figures, wherein like numerals represent like parts.

DETAILED DESCRIPTION

Figure 1A:
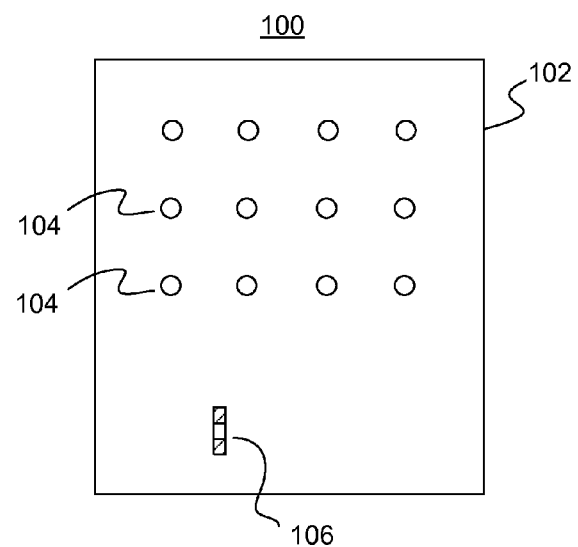
FIGS. 1A and 1B diagrammatically illustrate an exemplary module and array, respectively, which include ESD protection consistent with the present disclosure.

Light emitting diodes (LEDs), a type of optoelectronic device, may be damaged when exposed to reverse bias voltage and associated current, e.g., resulting from a transient event such as electrostatic discharge (ESD). Indeed, modern LEDs are often highly sensitive to ESD events that generate reverse bias voltages and associated currents, regardless of whether those reverse bias voltages/currents are relatively large or relatively small. The systems and methods of the present disclosure address this issue through the use of a combination of an ESD embedded circuit board and one or more diodes to protect electronic components such as LEDs from voltages produced during a transient event, such as an electrostatic discharge. As will be described in detail below, such systems and methods can protect sensitive electronic components from low level and high level ESD events.

For the purpose of the present disclosure, the term "ESD embedded circuit board" means a circuit board (e.g., a printed circuit board) that provides an intrinsic level of protection against ESD events, without the use of other components that may be attached or deposited onto the circuit board, and particularly without the use of one or more diodes. In some embodiments, the ESD embedded circuit boards described herein may protect electronic components from ESD events that produce or otherwise involve a voltage exceeding a characteristic voltage of the ESD embedded circuit board. Such ESD events are referred to herein as "high level ESD events," or "high level ESDs."

The term "characteristic voltage" is used herein to mean an applied voltage that "triggers" or "causes" at least a portion of the ESD embedded circuit board to transition from an electrically non-conductive state to an electrically conductive state. The terms "low level ESD" and "low level ESD event," are interchangeably used herein to mean an ESD event that produces or otherwise involves a voltage that is less than a characteristic voltage of an ESD embedded circuit board.

An ESD embedded circuit board may for example have a characteristic voltage of about 70V or more, such as about 80V, about 90V, about 100V, about 110V, about 120V, or even about 240V. As a result, the ESD embedded circuit board may protect components attached thereto from high level ESD events by shunting voltage and conducting associated current to a ground plane, as will be described later. Because the characteristic voltage of the ESD embedded circuit board is relatively high, however, it may not protect components attached thereto from low level ESD events, i.e., events producing voltage below about 70V or whatever the characteristic voltage of the ESD embedded circuit board may be. As a result, components such as LEDs attached to an ESD embedded circuit board may still be susceptible to damage from a low level ESD event.

To protect components from low level ESDs, the systems and methods of the present disclosure may utilize one or more diodes attached to and/or deposited on an ESD embedded circuit board. The diodes described herein may any suitable diode, such as a surface mount diode, a thin-film diode ("TFD"), combinations thereof, and the like. As will be described later, the diode(s) of the present disclosure may be coupled in parallel or in series with electronic components. In either case, the diode(s) described herein may have electrical characteristics that protect associated electronic components such as LEDs from being exposed to damaging voltage and currents produced by low-level ESD events.

Figure 1B:
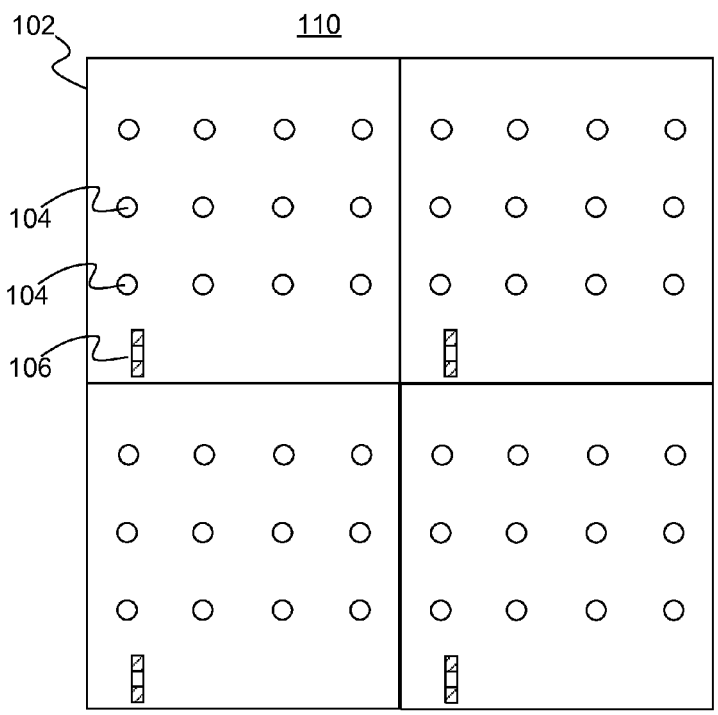

Reference is now made to FIGS. 1A and 1B, which depict a non-limiting example of a module and array of modules consistent with present disclosure. As shown in FIG. 1A, module 100 includes ESD embedded circuit board 102, which supports a plurality of electronic components 104. ESD embedded circuit board 102 also supports a single diode 106, which is connected in parallel or in series with plurality of electronic components 104. As illustrated in FIG. 1B, multiple modules 100 may be organized into an array 110, e.g., as may be found in a lighting device component.

ESD embedded circuit board 102 may be flexible or rigid, and includes one or more voltage switchable dielectric materials, also referred to herein as a "voltage switchable dielectric," or VSDs. The terms "voltage switchable dielectric material," "voltage switchable dielectric," "voltage switchable material" and "VSD" are interchangeably used herein to mean any composition or combination of compositions that are dielectric or non-conductive until a voltage greater than or equal to a characteristic voltage of the VSD material is applied, whereupon the VSD material becomes conductive. In other words, VSD materials become conductive upon the application of a voltage greater than or equal to the characteristic voltage (e.g., as provided by an ESD event), but are otherwise non-conductive. Alternatively or additionally, VSD materials may be understood as nonlinear resistance materials.

Any type of VSD material may be used in the ESD embedded circuit boards described herein. In some embodiments, the VSD materials described herein include conductive and/or semiconductive particles that are heterogeneously or homogenously distributed in a binder, such as a polymeric binder. For example, the VSD materials described herein may include first particles and second particles that are distributed in a binder material, wherein the second particles are different from the first particles. The first and second particles may be selected from conductive and/or semiconductive particles.

In some embodiments, at least one of the first and second particles in the VSD materials described herein are high aspect ratio particles (HAR) particles. HAR particles may be understood as particles having an aspect ratio (largest dimension:smallest dimension, e.g., length:diameter or length:cross-section) ranging from about 10:1 to about 100:1, or even about 10:1 to about 1000:1. Of course, particles with an aspect ratio greater than or within the foregoing ranges are contemplated by the present disclosure, and may be used. Accordingly, all or a portion of the particles of the present disclosure may be in the form of spheroids, platelets, fibers (e.g., nanofibers), rods (e.g., nanorods), tubes (e.g., nanotubes), combinations thereof, and the like. Non-limiting examples of HAR particles include single or multiwalled carbon nanotubes, carbon black, and carbon fullerenes.

Alternatively or additionally to HAR particles, the VSD materials described herein may include organic and/or inorganic particles, which may be conductive or semiconductive. Non-limiting examples of such particles include particles that are formed from or include copper, nickel, gold, silver, cobalt, zinc oxide, tin oxide, indium tin oxide, indium zinc oxide, bismuth oxide, cerium oxide, antimony zinc oxide, silicon, silicon carbide, titanium dioxide, boron nitride, aluminum nitride, nickel oxide, zinc oxide, zinc sulfide, bismuth oxide, cerium oxide, iron oxide, metal and/or complexes selected from oxides, metal nitrides, metal carbides, metal borides, metal sulfides, combinations thereof, and the like. Without limitation, particles included in the VSD materials described herein may include a combination of metallic conductive particles with semiconductive particles including one or more of silicon, silicon carbide, titanium dioxide, boron nitride, aluminum nitride, nickel oxide, zinc oxide, zinc sulfide, bismuth oxide, cerium oxide, iron oxide, metal and/or complexes selected from oxides, metal nitrides, metal carbides, metal borides, and metal sulfides.

Any suitable type of binder may be used in the VSD materials described herein. In some embodiments, the binder includes one of more of a silicone polymer, a phenolic resin, an epoxy, a polyurethane, poly(meth)acrylate, a polyamide, a polyester, a polycarbonate, a polyacrylamide, a polyimide, polyethylene, polypropylene, polyphenylene oxide, polysulphone, sol-gel materials, ceramers, combinations thereof, and the like.

Without limitation, preferred VSD materials that may be used in accordance with the present disclosure include those described in U.S. Pat. No. 7,695,644, the entire content of which is herein by reference.

Figure 2:
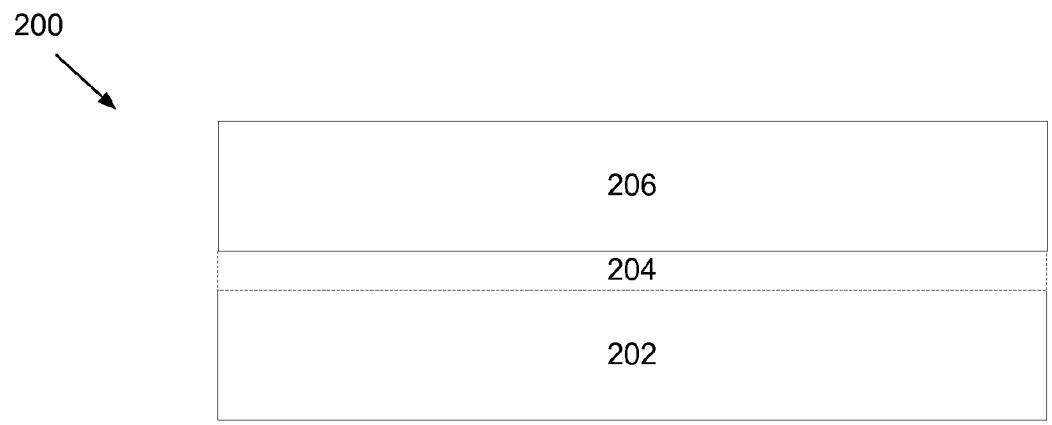
FIG. 2 illustrates an exemplary ESD embedded circuit board consistent with the present disclosure.

Reference is now made to FIG. 2, which illustrates a non-limiting example of an ESD embedded circuit board that may be used in accordance with the present disclosure. As shown, ESD embedded circuit board 200 includes ground plane 202, a layer of VSD material 204, and optional second layer 206. In general ground plane 202 provides a pathway to electrical ground. Thus, for example, ground plane 202 may include or be formed from a conductive material, such as copper, silver, gold, aluminum, or the like. In some embodiments, ground plane 202 is a copper sheet, a layer of copper, or a layer of another conductive material on or within a substrate such as a fiber reinforced composite.

In the illustrated embodiment, VSD material 204 is present on ground plane 202. For simplicity and ease of understanding, VSD material 204 is illustrated in FIG. 2 as a continuous layer in direct contact with ground plane 202. It should be understood however that VSD material 204 may have any desired configuration. For example, VSD material 204 may be deposited on isolated areas of ground plane 202, in a pattern on ground plane 202, combinations thereof, and the like. Likewise, VSD material 204 need not be in direct contact with ground plane 202. For example, VSD material 204 may be positioned remotely from ground plane 202, but may be in electrical contact with ground plane 202, e.g., through one or more wires, bond pads, contacts, combinations thereof, and the like.

Electronic components (not shown) may be bonded or otherwise applied to ESD embedded circuit board 200. In some embodiments, such components may be bonded directly to VSD material 204. Alternatively or additionally, such components may be bonded to optional second layer 206 of conductive material (e.g., copper, silver, gold, aluminum, and the like), which itself may bonded, adhered, or otherwise in electrical contact with VSD material 204.

Figure 3:
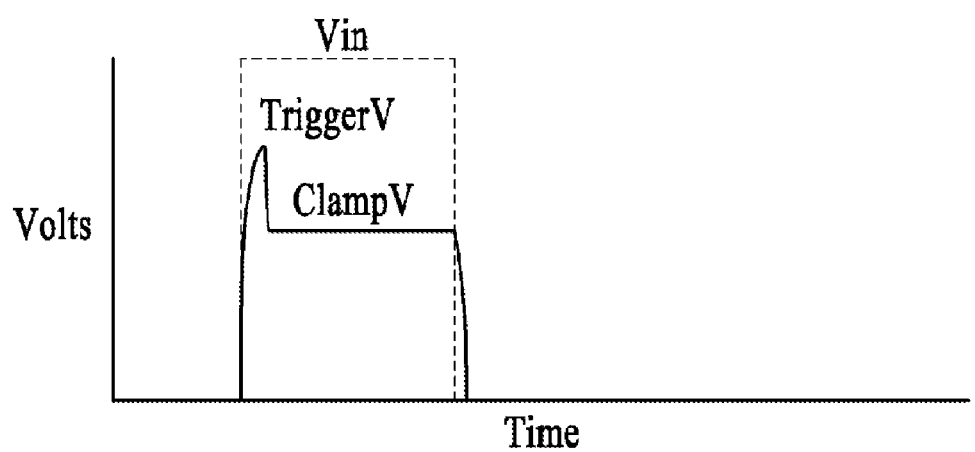
FIG. 3 is an exemplary plot of certain electrical characteristics of a voltage switchable dielectric material consistent with the present disclosure.

As explained previously, the VSD materials described herein can transition from a non-conductive state to a conductive state upon the application of a voltage above their characteristic voltage. This concept is generally illustrated in FIG. 3, which is an exemplary plot of the basic electrical properties of the VSD materials described herein. In general the characteristic (trigger) voltage is the voltage level at which the VSD material becomes conductive. Prior to application of Vin exceeding the characteristic (trigger) voltage, the VSD material is non-conductive. The clamp voltage (ClampV) in the graph is the voltage level required to maintain the VSD material in a conductive state, once the material has transitioned to such state. Generally, ClampV is less than the characteristic voltage (TriggerV).

In some embodiments of the present, the VSD materials used in the ESD embedded circuit boards described herein are chosen such that their characteristic voltage exceeds an operating voltage of an electronic circuit associated with one or more electronic components, e.g., electronic components 104 of FIG. 1. In other words, the characteristic voltage may be selected such that the VSD material is non-conductive during normal operation of the circuit, but becomes conductive when the substrate is exposed to a high level ESD event.

The characteristic voltage of the VSD materials described herein may vary widely. In some embodiments, the characteristic voltage of the VSD materials described herein ranges from greater than or equal to about 28V, greater than or equal to about 40V, greater than or equal to about 50V, greater than or equal to about 60V, greater than or equal to about 70V, greater than or equal to about 80V, greater than or equal to about 120V, or even greater than or equal to about 240V. Of course, such values are exemplary only, and VSD materials with characteristic voltages above, below, and within the foregoing values are envisioned by the present disclosure. In some embodiments, the characteristic voltage exceeds a reverse bias voltage that would damage an electronic component such as an LED.

The characteristic voltage of the VSD materials described herein may also be understood in terms of voltage per unit of gap and/or material thickness. Thus for example, the VSD materials described herein may exhibit a characteristic voltage ranging from greater than or equal to about 14V/mil, such as greater than or equal to about 15V/mil, greater than or equal to about 20V/mil, or even greater than or equal to about 25V/mil (mil=0.001 inch or 0.0254 mm). Thus, when a VSD material having a characteristic voltage of 14V/mil is applied across a 5 mil (0.005 inch) gap (a typical minimum gap width for a circuit board plated with 1 ounce of copper), the characteristic voltage of the VSD material will be about 70V. That is, the VSD will switch from non-conductive to conductive upon the application of a voltage exceeding about +/−70V, e.g., resulting from an ESD event.

For the sake of illustration and ease of understanding, the present disclosure will now describe the operation of a non-limiting embodiment wherein ESD embedded circuit board 200 in FIG. 2 is used as ESD embedded circuit board 102 of FIG. 1A. It should be understood that this description may equally apply to other embodiments of the present disclosure (e.g., as shown in FIGS. 5, 6, 8 and 9A).

In this exemplary embodiment, a voltage Vin may be applied to ESD embedded circuit board 102, 200 to drive electronic components 104 bonded or otherwise electrically connected thereto, in this case LEDs. Without limitation, the Vin applied during normal operation is preferably less than the characteristic voltage (e.g., 70V or more) of VSD material 204 included in or forming ESD embedded circuit board 102, 200. In such instances, VSD material 204 remains in a non-conductive state during normal operation of circuit board 102, 200. Upon the occurrence of a high level ESD event, the Vin (which may be forward or reverse bias) may exceed the characteristic voltage of VSD material 204, causing VSD material 204 to transition from a non-conductive to a conductive state. In this conductive state, VSD material 204 can shunt voltage and/or current produced during the high level ESD event to ground plane 202, thereby preventing the voltage and current from reaching components 104. In this way, VSD material 204 in ESD embedded circuit board 102, 200 can protect electronic components 104 on the ESD embedded circuit board from potentially damaging voltage and currents produced during a high level ESD event.

Returning to FIGS. 1A and 1B, components 104 may be any type of component that is susceptible to damage from voltage and/or current produced during a transient event, such as a high level or low level ESD. In some embodiments, electronic components are in the form of light emitting diodes. In this regard, it is noted that modern LEDs and other electronic components may be damaged by exposure to reverse bias voltage and associated currents, even if such reverse bias voltage/current is relatively small. In the case of LEDs, for example, electronic components 104 may be damaged by exposure to reverse bias voltage that is greater than 0 to less than or equal to about 70V, such as greater than 0 to about 60V, greater than 0 to about 50V, greater than 0 to about 40V, greater than 0 to about 30V, greater than 0 to about 20V, greater than 0 to about 15V, greater than 0 to about 14V, greater than 0 to about 10V, greater than 0 to about 5V, or even greater than 0 to about 3V. In some embodiments, electronic components 104 (e.g., LEDs) may be damaged by exposure to reverse bias voltage ranging from greater than 0 to about 70V, about 1 to less than or equal to about 70V, about 2 to less than or equal to about 70V, about 3 to less than or equal to about 70V, about 4 to less than or equal to about 70V, about 5 to less than or equal to about 70V, or even about 10 to less than or equal to about 70V. In some instances, a voltage (forward or reverse bias) that may damage a component is referred to herein as a first voltage level.

In many instances, the characteristic voltage of an ESD embedded circuit board may exceed the first voltage level (in forward or reverse bias) that electrical components 104 may withstand without being damaged. As noted previously, for example, an ESD embedded circuit board may include a VSD material with a characteristic voltage of about 70V. As such, the ESD embedded circuit board may protect components electrically connected thereto from high level ESD events, i.e., events generating voltage levels of about 70V or more, as previously described. However, the ESD embedded circuit board may not mitigate low level ESD events, which produce voltage levels that are less than the characteristic voltage of the circuit board/VSD material, but which may still be higher than the first voltage level. In other words, the VSD material in ESD embedded substrate 102, 200 may remain in a non-conductive state during a low level ESD event, thus allowing voltage and current (in forward and/or reverse bias) produced during that event to reach electronic components 104.

To protect components 104 from low level ESD events, diode 106 is mounted or otherwise attached to ESD embedded circuit board 102, and connected in parallel or in series with components 104. Diode 106 may be any suitable diode, such as a surface mount diode, a thin film diode ("TFD"), or the like, provided that it has suitable electrical characteristics to enable it to protect components 104 from low level ESD events. For example, in instances where diode 106 is connected in parallel to components 104, diode 106 may be a zener diode that has a peak inverse voltage (i.e., a maximum reverse bias voltage rating) that enables it to protect components 104 from potentially damaging voltage produced during a low level ESD. In instances where diode 106 is connected in series with components 104, diode 106 may function to prevent potentially damaging current and/or voltage, produced during a low level ESD, from reaching components 104.

In some embodiments, the diodes of the present disclosure may be configured such that they are capable of protecting components from low level ESD events that produce reverse bias voltage ranging from greater than 0 to about 70V, about 1 to less than or equal to about 70V, about 2 to less than or equal to about 70V, about 3 to less than or equal to about 70V, about 4 to less than or equal to about 70V, about 5 to less than or equal to about 70V, or even about 10 to less than or equal to about 70V. For example, the diodes described herein may function to block the transmission of reverse bias voltage (e.g., in excess of a first voltage level) and associated current to sensitive electronic components such as LEDs, while allowing forward bias voltage and associated current to pass.

Returning again to FIG. 1A, module 100 is illustrated as including a single diode 106, which is responsible for protecting a plurality of components 104 from low level ESD events. More specifically, in this illustrated embodiment one (1) diode 106 is responsible for protecting twelve (12) LEDs 104 from low level ESD events. This concept is carried through in FIG. 1B, wherein array 110 includes a plurality of modules 100, each of which include a single diode 106 for protecting a plurality of LEDs.

Figure 4:
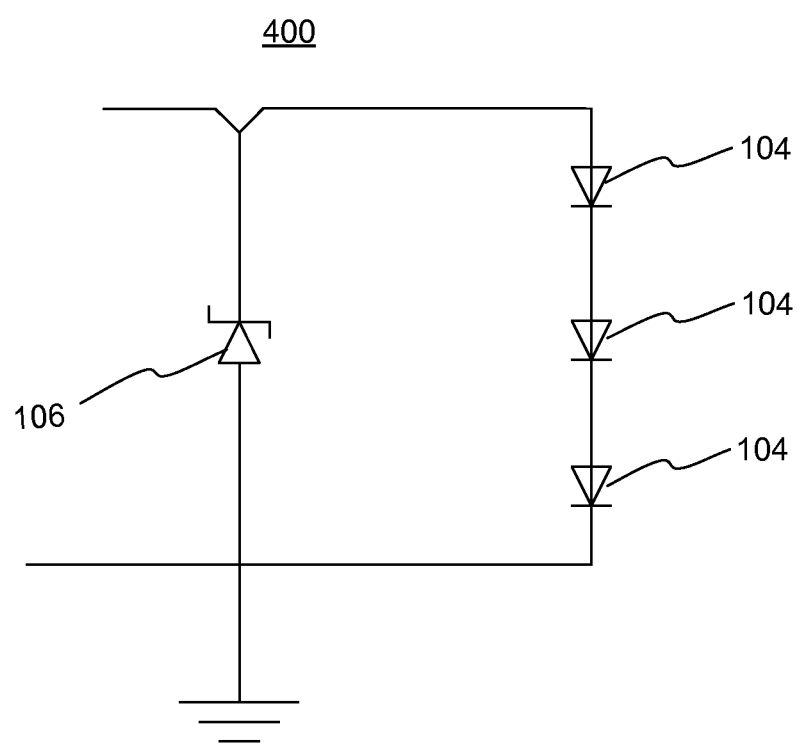
FIG. 4 is an exemplary ESD protection circuit consistent with the present disclosure.

As noted previously, diode 106 may be connected in parallel with components 104. This concept is generally illustrated in FIG. 4, wherein ESD protection circuit 400 includes a string of components 104 (in this case, LEDs) connected in parallel with diode 106, e.g., a zener diode. In this instance, diode 106 may have a peak inverse voltage that is less than the characteristic voltage of the underlying ESD embedded circuit board, and less than a first voltage level at which one or more of components 104 would be damaged. For example, if components 104 would be damaged by reverse bias voltage greater than or equal to 4V, diode 106 may be configured to have a peak inverse voltage less than 4V. If a voltage (produced by a low level ESD) exceeds the peak inverse voltage of diode 106, diode 106 may clamp the voltage at a safe level for components 104, and dissipate any voltage above its clamping voltage.

Although the configurations shown in FIGS. 1A, 1B and 4 are effective for some applications, the degree of ESD protection provided by diode 106 may decrease with distance from one or more of components 104. That is, as the distance between diode 106 and a component 104 increases, the amount of ESD protection diode 106 can provide to such a component may decrease. Moreover, diode 106 may not protect components 104 in a circuit from low level ESD events that occur at certain regions within the circuit, such as between respective components 104 in FIG. 4.

One mechanism for addressing this issue is to increase the number of diodes that provide low level ESD protection for associated electronic components. In this regard, the present disclosure envisions ESD protection circuits that include a ratio of ESD protecting diodes to associated electronic components ranging from about 1:10, 1:5, 1:2, 1:1, 2:1, 3:1, 5:1, 10:1, 100:1 or even about 1000:1 or more. Of course, such ratios are exemplary only, and any ratio of ESD protecting diodes to electronic components may be used in accordance with the present disclosure.

Figure 5:
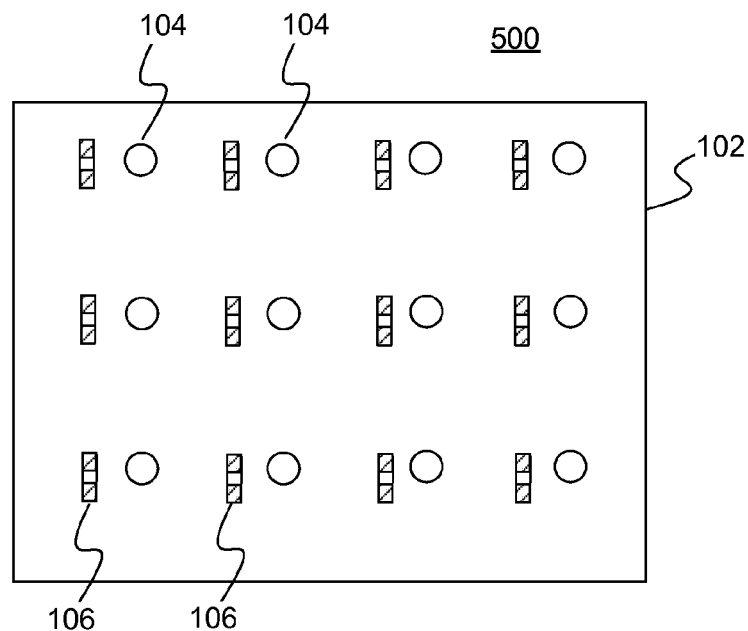
FIG. 5 diagrammatically illustrates another exemplary module including ESD protection consistent with the present disclosure.
Figure 6:
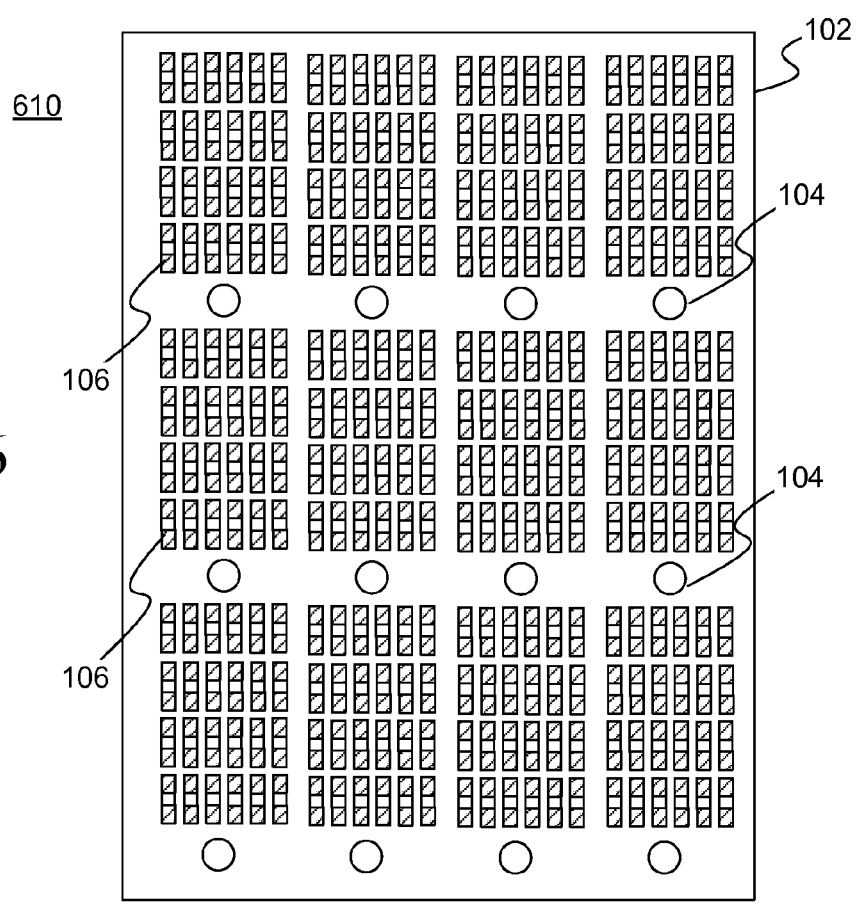
FIG. 6 diagrammatically illustrates another exemplary array including ESD protection consistent with the present disclosure.

As non-limiting illustrations of this concept, reference is made to FIGS. 5 and 6, which depict another exemplary module and array consistent with the present disclosure. As shown, module 500 and array 610 include an ESD embedded circuit board 102, which supports a plurality of electronic components 104 and a plurality of diodes 106. The general nature and function of each of these components is the same as described above in connection with the embodiment shown in FIGS. 1A and B, and for the sake of brevity is not reiterated here.

As shown in FIG. 5, each component 104 is associated with a single diode 106, which protects it against low level ESD events. Thus, the ratio of diodes 106 to components 104 in the illustrated embodiment is 1:1. In this way, each component is protected by a corresponding diode, which may offer an enhanced level of low level ESD protection relative to the embodiments shown in FIGS. 1A and 1B, wherein a single diode 106 is responsible for protecting multiple components 104.

To even further enhance low level ESD protection, an even larger number of diodes may be used to protect individual components. This concept is shown in FIG. 6, in which exemplary array 610 of modules (not labeled) each include an ESD embedded substrate 102, a plurality of components 104, and a plurality of diodes 106. In particular, each component 104 is protected against low level ESD events by 16 diodes 106. Of course, the number of diodes illustrated in FIG. 6 is exemplary only, and any number of diodes may be used. In any event, increasing the number of diodes may allow designers to place as many ESD protection points as needed in a circuit. Indeed, this can allow designers to protect sub-regions of a circuit with one or more diodes, so as to achieve a desired level of ESD protection. As may be appreciated, this may enhance protection of components 104 against low level ESD events.

Figure 7:
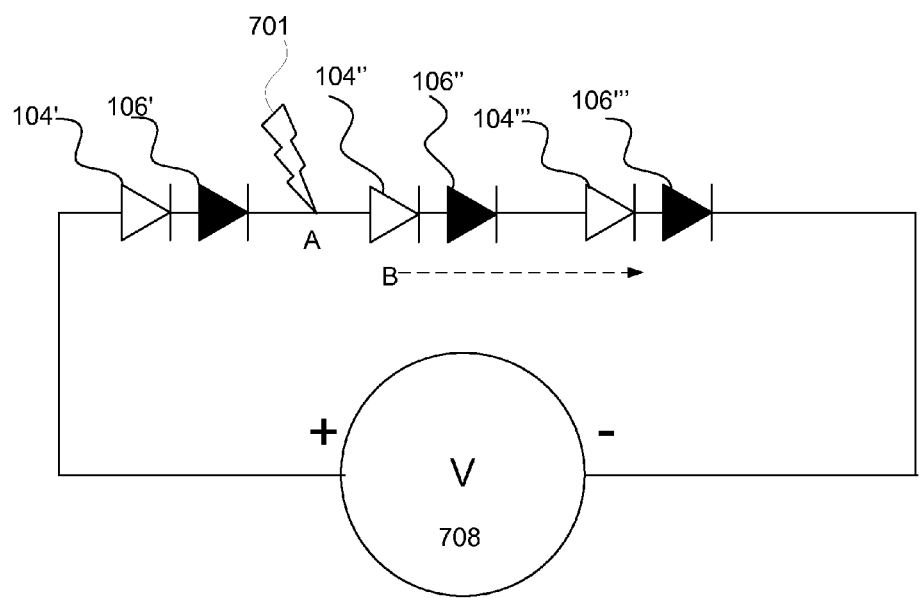
FIG. 7 diagrammatically illustrates another ESD protection circuit consistent with the present disclosure.

As noted previously, the diodes of the present disclosure may be connected in series with one or more electrical components. FIG. 7. is an exemplary illustration of this concept. As shown, circuit 700 includes voltage source 708, a plurality of electrical components (in this case, LEDs) 104', 104;", 104''', and a plurality of diodes 106', 106", 106'''. Each component is connected in series to a complementary diode. In this embodiment, each diode may be configured to preclude reverse bias breakdown in the event of a low level ESD event. That is, each diode may have a peak inverse voltage (i.e., a maximum reverse-bias voltage rating) that is sufficient to withstand reverse bias voltage that is less than the characteristic voltage of an ESD embedded circuit board. As a result, the presence of the diode may effectively protect an associated component from exposure to damaging voltage during low level ESD events.

By way of example, low level ESD event 701 may occur between components 104' and 104", at point A. In the absence of diode 106', low level ESD event 701 may generate voltage and current that could dissipate counter clockwise around circuit 700, i.e., in a reverse bias direction, resulting in damage to component 104'. Due to the presence of diode 106' however, the voltage and current produced by low level ESD event 701 is forced to dissipate in a clockwise (i.e. forward bias direction), as generally illustrated by line B. Although this may expose components 104" and 104''' to elevated forward bias voltage and current, such components may be able to tolerate such conditions. This is particularly true in the case of modern LEDs, which may be sensitive to reverse bias voltage but have higher tolerance for forward bias voltage.

While FIG. 7 depicts circuit 700 as including a single complimentary diode for each component, it should be understood that this configuration is exemplary only, and that any number of diodes may be used. For example, circuit 700 may be configured to include a plurality of complimentary diodes for each component 104', 104", 104". Such diodes may be, located, for example, between components 104' and 104", between components 104" and 104''', and/or between component 104''' and the anode of voltage source 708.

As noted previously, the systems and methods of the present disclosure may utilize any suitable diode to protect electronic components from low level ESD events, including surface mounted diodes and thin films diodes. As may be appreciated, surface mount diodes may have certain characteristics that may limit their usefulness in electrostatic discharge protection applications. For example, surface mount diodes are relatively large in size, and thus can take up significant real estate on the surface of a printed circuit board. The number of surface mount diodes that may be used in an electrostatic discharge protection application may therefore be limited by the amount of available space that can be allocated to diode placement. Surface mount diodes also often require the use of pick and place technology, wherein individual diodes are manually or automatically placed at desired regions of a circuit board. Although pick and place technology is a viable technique for manufacturing electronics, it can be time consuming, particularly when large numbers of diodes are placed in an electronic device. Moreover, surface mount diodes and pick and place technology may not allow placement of diodes at certain desired circuit locations for ESD protection.

Thus without limitation, the diodes described herein are preferably in the form of thin film diodes (TFDs) that are deposited on or otherwise attached to an ESD embedded circuit board. In contrast to surface mount diodes, TFDs are relatively small compared to surface mount diodes, and may be easily deposited in large numbers across a wide area. As a result, the number of TFDs that may be included in an ESD protection circuit may be virtually unlimited.

Any type of TFD may be used in the systems and methods of the present disclosure, so long as it has suitable electrical characteristics for use in ESD protection applications. Thus for example, the TFDs described herein may be configured as a zener diode having a reverse breakdown voltage that is suitable for protecting one or more electronic components from low level ESD events, as previously described. Alternatively or additionally, the TFDs described may be configured to resist reverse bias voltage and/or current at a level that would damage one or more components that the TFD was positioned to protect.

In some embodiments, the TFDs described herein include at least one layer of an n-type semiconductive material and at least one layer of a p-type semiconductive material. Any suitable type of n- or p-type semiconductive material may be used. For example, the n- and p-type semiconductive material may be an inorganic material, an organic material (e.g., a semiconductive polymer), or a combination thereof. In some embodiments, the n- and p-type semiconductive materials are both organic materials, e.g., semiconductive p- and n-type polymers. As one non-limiting example of an n-type semiconductive polymer that may be used, mention is made of poly[2-methoxy-5-(2-ethyl-hexyloxy)-1,4-(1-cyanovinylene)phenylene ("CN-PPV). Non-limiting example of p-type semiconductive polymers that may be used include polypyrrole (PPy) and poly(3,4, ethylenedioxythiophene) (PEDOT).

The TFDs described herein may be deposited on a ESD embedded circuit board in any suitable manner. For example, one or more layers of a TFD may be deposited on an ESD embedded circuit board by aerosol jetting, atomic layer deposition (ALD), spatial atomic layer deposition (S-ALD), chemical vapor deposition (CVD), metal-organic CVD, pulsed laser deposition (PLD), sputtering, direct writing (e.g., via positive displacement), printing (e.g., ink-jet printing), combinations thereof, and the like. In some embodiments, the thin-film diodes described herein are organic diodes that are deposited via a printing process, such as ink-jet printing. In other non-limiting embodiments, the thin film diodes described herein are inorganic diodes that are deposited via atomic layer deposition.

As will be understood by those skilled in the art, each of these deposition processes include a plurality of associated parameters whose nominal values may be selected and/or adjusted to yield a thin film structure with one or more desired properties. As used herein, use of the term "nominal" or "nominally" when referring to an amount means a designated or theoretical amount that may vary from the actual amount. For example, process parameters associated with pulsed laser deposition include temperature, deposition pressure, laser repetition rate, total number of laser pulses, and the gas environment to grow the films, e.g. $N_2$, $H_2$, Ar or forming gas. The nominal value(s) of one or more parameters chosen may depend on the substrate material, a desired thickness of the thin film structure and/or a desired surface characteristic (e.g., uniform or non-uniform) of the thin film structure. Nominal value(s) of the parameters may be adjusted during the deposition process to thereby change one or more characteristics of the thin film structure. In any case, the foregoing deposition techniques can allow TFDs to be deposited directly on an ESD embedded substrate at any desired location. As a result, circuit designers may place as many ESD protection points as needed, thereby protecting any or all components on a circuit as desired.

Figure 8:
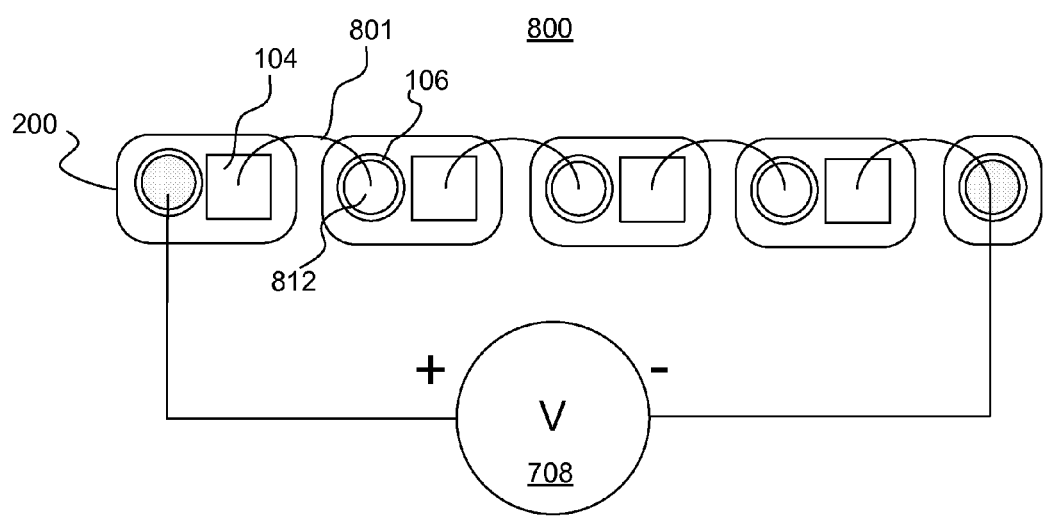
FIG. 8 diagrammatically illustrates an exemplary arrangement of electrical components including ESD protection consistent with the present disclosure.

FIG. 8 illustrates another non-limiting embodiment of an ESD protection circuit consistent with the present disclosure. As shown, circuit 800 includes voltage source 708, a plurality of components 104 bonded or otherwise adhered to respective ESD embedded substrates (traces) 200, and a plurality of thin film diodes (TFDs) 106. In this embodiment, components 104 may be light emitting diodes, such as but not limited to gallium nitride LEDs. Of course, the use of gallium nitride LEDs is exemplary only, and any type of LED or combination of LED types may be used as components 104.

Wires 801 connect individual components 104 to bond pads 812 of ESD embedded circuit board 200. As such, FIG. 8 may be understood as depicting a wire-bonded array of components 104. As illustrated in this embodiment, TFDs 106 are formed such that they are adjacent to bond pads 812 of ESD. Placement in this manner may allow TFDs 106 to adequately protect components 104 from reverse bias voltage produced during low level ESD events, as previously described. Moreover, close placement of TFDs 106 to bond pads 812 may preclude the occurrence of ESD events between the respective TFD and the bond pad.

Of course, the systems and methods of the present disclosure are not limited to providing ESD protection in wire bonded applications. Indeed, the use of TFDs in conjunction with an ESD embedded circuit board to provide ESD protection may be used in any suitable application. In this regard, reference is made to FIGS. 9A and 9B, which illustrate another exemplary ESD protection circuit consistent with the present disclosure. Like the other embodiments, the circuit 900 in FIG. 9A includes a voltage source 708 and a plurality of ESD embedded circuit boards 200 (traces). A gap 905 is present between respective ESD embedded circuit board/traces 200. Bridging each gap is a component 104, e.g., a light emitting diode. As such, FIG. 9A may be understood as illustrating a "flip chip" or "direct-attach" configuration.

Figure 9A:
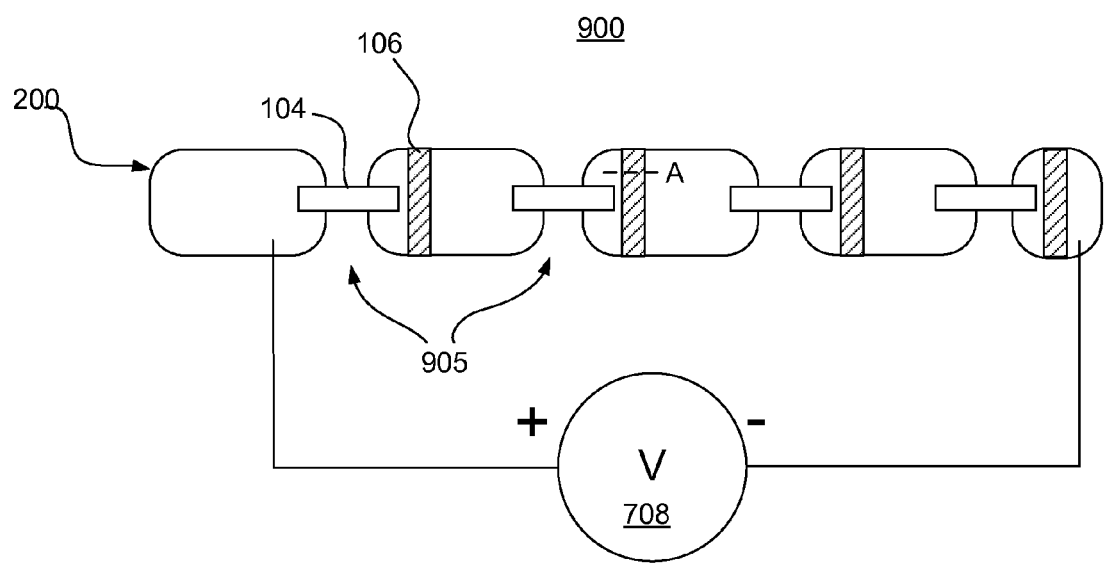
FIG. 9A diagrammatically illustrates another exemplary arrangement of electrical components including ESD protection consistent with the present disclosure.

As shown in FIG. 9A, each component 104 is protected on its anode side by a TFD 106. TFD 106 may be deposited/located at any position on ESD embedded circuit board 200. Without limitation however, TFDs 106 are preferably placed close to their respective components. For example, the distance between TFDs 106 and their respective components may range from less than or equal to about 5 mm, less than or equal to about 2.5 mm, less than or equal to about 1 mm, less than or equal to about 500 microns, less than or equal to about 100 microns, or less. Placement of a TFD close to its respective component can reduce the risk of low level ESD events occurring between the TFD and its component. In any case TFD 106 can protect its respective component 104 from reverse bias voltages that might arise downstream, e.g., from a low level ESD event.

Figure 9B:
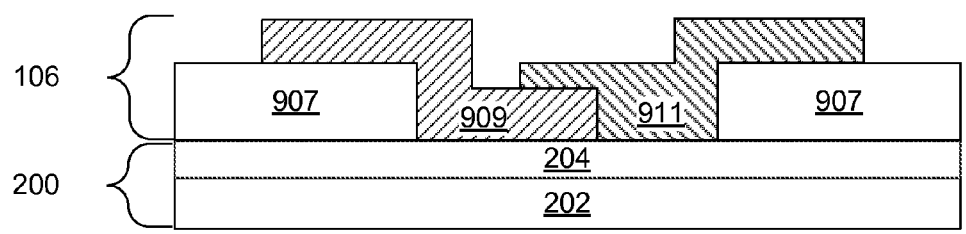
FIG. 9B is an exemplary diagram of a cross section taken at line A of FIG. 9A.

FIG. 9B is a cross sectional diagram of one element of circuit 900, taken along line A of FIG. 9. As shown in this cross sectional diagram, ESD embedded substrate 200 includes ground plane 202 and VSD material 204. The nature and function of these components has been previously described in connection with FIG. 2, and for the sake of brevity is not repeated herein. TFD 106 includes conductive layers 907, n-type semiconductor material layer 909 ("n-type layer 909"), and p-type semiconductor layer 911 ("p-type layer 911"). Conductive layers 907 may be formed from any conductive material, e.g., copper, aluminum, gold, silver, combinations thereof and the like. N-type layer 909 and p-type layer 911 may be formed from any n-type semiconductor material and p-type semiconductor material, as previously described. In some embodiments, n-type layer 909 is formed from poly[2-methoxy-5-(2-ethyl-hexyloxy)-1,4-(1-cyanovinylene)phenylene ("CN-PPV), and p-type layer 911 is formed from polypyrrole (PPy) or poly(3,4, ethylenedioxythiophene) (PEDOT).

As may be appreciated, conductive layers 907 may be formed via any deposition process suitable for depositing conductive materials, such as but not limited to sputtering, chemical vapor deposition, physical vapor deposition, atomic layer deposition, combinations thereof, and the like. Similarly, n-type layer 909 and p-type layer 911 may be formed using any suitable deposition technique. For example, if n-type layer 909 and p-type layer 911 are organic materials such as the previously described polymers, they may be deposited on ESD embedded substrate using a printing technique (e.g., ink-jet printing, spraying, etc.), chemical vapor deposition, physical layer deposition, combinations thereof, and the like.

Figure 10:
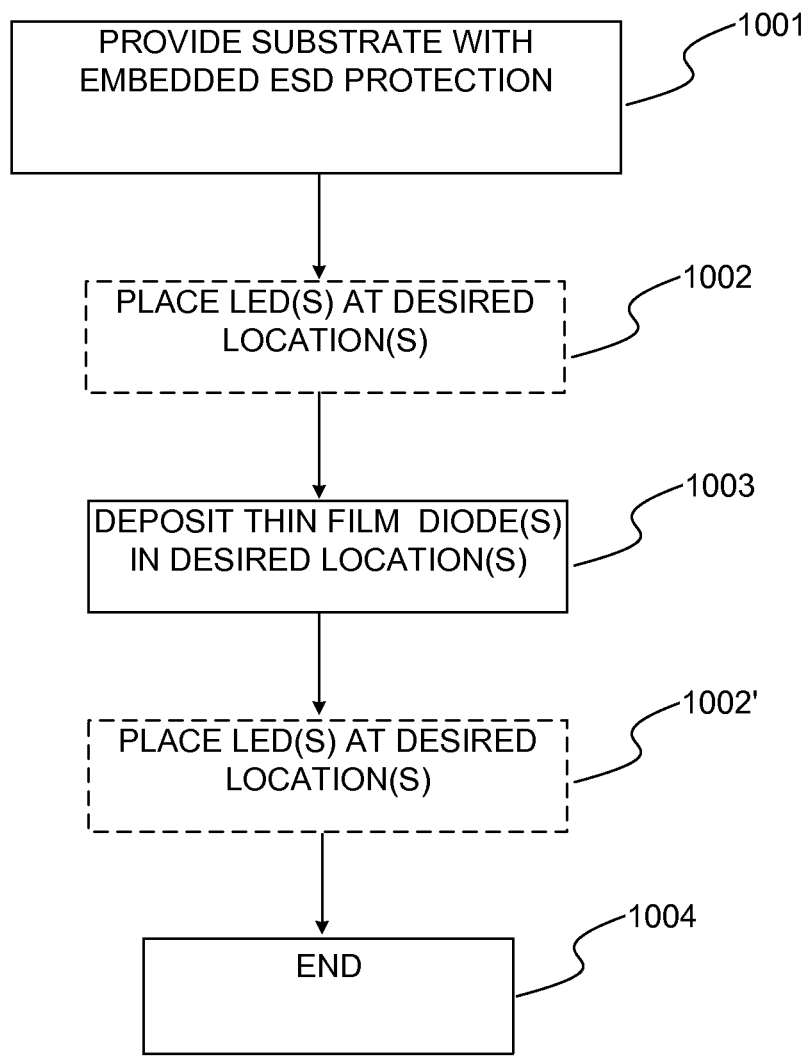
FIG. 10 is a block flow diagram of an exemplary method consistent with the present disclosure.

Another aspect of the present disclosure relates to methods of providing electrostatic discharge protection to one or more electrical components, such as LEDs. In this regard, reference is made to FIG. 10, which is a block flow diagram illustrating an exemplary method consistent with the present disclosure. As shown, the method 1000 begins at block 1001 with the provision of a substrate having embedded ESD protection, i.e., an ESD embedded circuit board. As noted previously, the ESD embedded circuit board may be in the form of a flexible or rigid circuit board, e.g., as illustrated in FIG. 2. Without limitation, the ESD embedded circuit board is preferably flexible, as the use of a flexible circuit board opens up avenues to high volume processing techniques such as a reel to reel manufacturing.

Once an ESD embedded circuit board is provided, the method may proceed to optional block 1002, wherein one or more electrical components (e.g., LEDs) may be located at desired locations on the substrate. Alternatively, optional block 1002 may be skipped, and the method may proceed directly to block 1003, wherein thin film diodes are deposited at desired locations on the ESD embedded circuit board. For example, the thin film diodes may be deposited on the ESD embedded circuit board such that they are or will be connected parallel to or in series with one or more components. Without limitation, the TFD diodes are preferably deposited in proximity to their corresponding component, so as to provide a desired level of low level ESD protection to the component, as previously described.

Once the TFD diode(s) has (have) been deposited, the method may proceed further. In the event that optional block 1002 was skipped, the method may proceed to block 1002', whereupon electrical components such as LEDs are placed at desired locations on the ESD embedded circuit board. In the event that optional block 1002 was executed and components were placed, block 1002' may be skipped. In any case, the method ends at block 1004.

Figure 11:
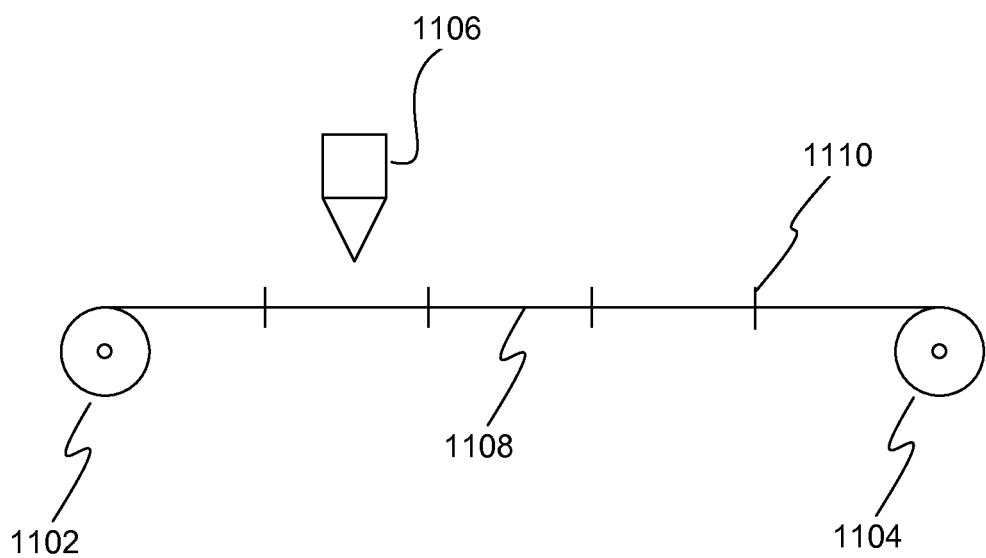
FIG. 11 depicts an exemplary reel to reel manufacturing process consistent with the present disclosure.

As noted previously, the TFDs may be deposited on a flexible ESD embedded circuit board, opening avenues to high volume manufacturing techniques such as reel to reel processing. In this regard, reference is made to FIG. 11, which diagrammatically illustrates a reel to reel manufacturing system 1100 for LED module fabrication consistent with the present disclosure. As shown, system 1100 includes out feed spool or reel 1102 and a take up spool or reel 1104. In operation, reel 1102 may feed out flexible ESD embedded circuit board 1108 for processing. More specifically, flexible ESD embedded circuit board may be unwound from reel 1102 and passed in a continuous feed motion under deposition device 1106, and subsequently wound onto reel 1104. Deposition device 1106 may be configured to deposit LEDs, TFD diodes and optionally other components onto flexible ESD embedded circuit board 1108. Flexible ESD embedded circuit board 1108 may later be divided into sections (e.g., along boundary lines 1110), where each section makes module of a device, e.g., a lighting module comprising an array of LEDs, TFD diodes and associated components.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A device including electro static discharge (ESD) protection, comprising:

an ESD embedded circuit board, said ESD embedded circuit board comprising a ground plane and a layer of a voltage switchable dielectric (VSD) material in direct contact with and electrically connected to said ground plane, said VSD material transitioning from a electrically non-conductive state to an electrically conductive state above said characteristic voltage;

an electrical component electrically coupled to said ESD embedded circuit board, said electrical component being susceptible to damage from exposure to a reverse bias current exceeding a first voltage level;

first and second conductive layers comprised of a conductive material, said first and second conductive layers being in direct contact with and electrically connected to said VSD material and being separated by a gap; and a thin film diode electrically coupled to said electrical component, said thin film diode comprising a layer of p-type semiconductive polymer and a layer of n-type semiconductive polymer, said layers of p-type and n-type semiconductive polymers being deposited on said VSD material in said gap so that said layer of p-type semiconductive polymer is in electrical contact with said first conductive layer, said layer n-type semiconductive polymer is in electrical contact with said second conductive layer, and said layers of p-type and n-type semiconductive polymers overlap;

wherein:
said ESD embedded circuit board has a characteristic voltage above which at least a portion of the circuit board transitions from an electrically non-conductive state to an electrically conductive state, said characteristic voltage being above said first voltage level; and said thin film diode has a peak inverse voltage sufficient to withstand reverse bias voltage that is less than said characteristic voltage.

2. The device of claim 1, wherein said characteristic voltage is greater than or equal to about 70V.

3. The device of claim 1, wherein said first voltage level ranges from greater than 0 to about 70V.

4. The device of claim 1, wherein said electrical component comprises a light emitting diode.

5. The device of claim 1 wherein said first conductive layer forms a bond pad and said thin film diode surrounds said bond pad.

\* \* \* \* \*